United States Patent

Matsuki et al.

[11] Patent Number: 5,960,252
[45] Date of Patent: Sep. 28, 1999

[54] METHOD FOR MANUFACTURING A SEMICONDUCTOR MEMORY DEVICE HAVING A FERROELECTRIC CAPACITOR

[75] Inventors: Takeo Matsuki; Jun Kawahara, both of Tokyo, Japan

[73] Assignee: NEC Corporation, Tokyo, Japan

[21] Appl. No.: 08/846,546

[22] Filed: Apr. 30, 1997

[30] Foreign Application Priority Data

May 14, 1996 [JP] Japan .................................... 8-118916

[51] Int. Cl.$^6$ .................................................. H01L 21/00
[52] U.S. Cl. ............................................ 438/3; 438/240
[58] Field of Search .................................. 438/240, 250, 438/787, 3, 239, 244, 253, 256, 393, 396, 399; 257/295, 296; 118/725

[56] References Cited

U.S. PATENT DOCUMENTS

| 5,119,154 | 6/1992 | Gnadinger | 257/295 |
| 5,496,410 | 3/1996 | Fukuda et al. | 118/725 |
| 5,506,748 | 4/1996 | Hoshiba | 257/296 |
| 5,688,720 | 11/1997 | Hayashi | 438/692 |

FOREIGN PATENT DOCUMENTS

| 0642167 | 8/1994 | European Pat. Off. . |
| 07050391 | 2/1995 | Japan . |
| 750391 | 2/1995 | Japan . |
| 07263637 | 10/1995 | Japan . |

OTHER PUBLICATIONS

Nishimoto et al, Low Temperature Chemical Vapor Deposition of Dielectric Films Using Ozone and Organosaline, 19$^{th}$ Conference on Solid State Devices and Materials, Tokyo, 1987, pp. 447–550.

Nguyen et al, Reaction Mechanisms of Plasma–and Thermal–Assisted Chemical Vapor Deposition of Tetraethylothosilicate Oxide Films, J. Electrochem. Soc., vol. 137, No. 7, Jul. 1990, pp. 2209–2215.

Primary Examiner—Charles Bowers
Assistant Examiner—Jack Chen
Attorney, Agent, or Firm—Hayes Soloway Hennessy Grossman & Hage PC

[57] ABSTRACT

A method for manufacturing a nonvolatile semiconductor memory device comprises the steps of forming a ferroelectric capacitor, sputtering a first dielectric film on the ferroelectric capacitor, and depositing a second dielectric film on the first dielectric film by a CVD process using tetraethylorthosilicate as a source gas and ozone as an oxidizing agent at a temperature between 350 and 500° C. The first dielectric film prevents hydrogen and water from being introduced into the ferroelectric film of the ferroelectric capacitor during and after the CVD process, thereby improving polarization, leakage current and dielectric breakdown characteristics of the ferroelectric capacitor.

7 Claims, 8 Drawing Sheets

METHOD FOR MANUFACTURING A SEMICONDUCTOR MEMORY DEVICE HAVING A FERROELECTRIC CAPACITOR

BACKGROUND OF THE INVENTION (a) Field of the Invention

The present invention relates to a method for manufacturing a semiconductor memory device having a ferroelectric capacitor and, more particularly, to an improvement of electric characteristics in a nonvolatile semiconductor memory device having a ferroelectric capacitor, such as polarization, dielectric breakdown and leakage current characteristics.

(b) Description of the Related Art

A ferroelectric capacitor having a ferroelectric film between pair of electrodes and a nonvolatile semiconductor memory device having such a ferroelectric capacitor have been proposed. Such a semiconductor memory device can be fabricated by a known fabrication process for a silicon semiconductor integrated circuit, into which the ferroelectric capacitors are further integrated. For example, a stacked ferroelectric capacitor can be formed as overlying a silicon switching transistor in a memory cell with an intervention of an interlayer dielectric film.

A conventional nonvolatile semiconductor memory device is described in, for example, Patent Publication Nos. JP-A-1995-50391 and JP-A-1995-263637. A first conventional nonvolatile semiconductor, memory device described in the former will be described with reference to FIG. 1. The semiconductor memory device has a silicon substrate 11, an oxide film 12 formed thereon for separation between memory cells, and a switching transistor in each memory cell including source 13a, drain 13b and gate electrode 15.

The memory device further includes an interlayer dielectric film 16 on the switching transistor, and a ferroelectric capacitor formed on the interlayer dielectric film 16 and having a top electrode 19 and a bottom electrode 17 sandwiching therebetween a ferroelectric film 18. A first protective layer 26 overlying the ferroelectric capacitor is formed on the entire surface and metallic interconnects 24a, 24b, 25a and 25b are formed thereon and within through-holes 22a, 22b, 23a and 23b formed in the protective film 26 and the underlying films. A second protective layer is then formed thereon including first silicon oxide film 27a doped with phosphorous and a second, undoped silicon oxide film 27b.

A second conventional nonvolatile semiconductor memory device described in JP-A-1995-263637 will be described with reference to FIG. 2 based on the fabrication method therefor. The steps up to fabrication of the ferroelectric capacitor are similar to those in the first conventional memory device of FIG. 1. In the second conventional memory device, the first protective layer 26 is implemented by a phospho-silicate glass (PSG) which is thermally treated or annealed in a nitrogen atmosphere to limit the water content within the first protective film 26 below 0.5 gram/cm$^3$.

It is recited in the publication that such a thermal treatment achieves suppression of leakage current and improvement of dielectric breakdown characteristics in the ferroelectric capacitor by limiting the water content. After the thermal treatment, through-holes 22a, 22b, 23a and 23b are formed for diffused regions 13a and 13b of the switching transistor and top and bottom electrodes 19 and 17 of the ferroelectric capacitor. Subsequently, metallic interconnects 24a, 24b, 25a and 25b for the diffused regions 13a and 13b and the ferroelectric capacitor are deposited, followed by plasma enhanced CVD (chemical vapor deposition) of silicon nitride or silicon nitride oxide film as a second protective layer 27.

In the conventional memory device, the deposition step and the presence itself of the first protective layer 26 covering the ferroelectric capacitor degrade electric characteristics of the ferroelectric capacitor, especially polarization and leakage current characteristics.

Specifically, if the protective layer 26 for the ferroelectric capacitor is made of silicon oxide, the deposition step for the protective layer 26 is generally effected by a CVD technique using a gas as a source material, sputtering technique using a solid source material and a coating and baking technique using a liquid source material. The source gas in the CVD technique generally contains hydrogen atoms or hydrides bonded to silicon atoms, as is the case of monosilane (SiH$_4$). The CVD step is conducted in a vacuum reactor or in an atmospheric condition by effecting decomposition of the source gas by plasma or thermal energy. Accordingly, some of the CVD processes generate a large amount of hydrogen during the deposition, which generally deoxidizes and degrades the ferroelectric film implemented as a metal composite oxide film. In this respect, even the protective layer made of silicon oxide film containing as low as below 0.5 gram/cm$^3$ water and described in JP-A-1995-263763 as mentioned above suffers from the problem water so long as the protective layer is formed by a CVD technique generating hydrogen.

The protective layer for the ferroelectric capacitor degrades the polarization characteristic of the ferroelectric film if the protective layer contains significant amount of water. FIGS. 3A and 3B each shows applied voltage dependency of polarization in the ferroelectric film containing water at 5% within the ferroelectric film before deposition step of the protective layer and after deposition of the protective layer at 300° C. As shown by these drawings, the deposition step for the protective layer degrades the polarization characteristic of the ferroelectric film in the ferroelectric capacitor.

In addition, the water in the protective layer covering the ferroelectric capacitor, even if limited to a reasonable content, itself causes a significant amount of leakage current in the ferroelectric capacitor and also affects polarization characteristic thereof. The water content less than 0.5 gram/cm$^3$ is not practical in fact because this water content makes a gel in the protective layer.

SUMMARY OF THE INVENTION

In view of the foregoing, it is an object of the present invention to provide a method for manufacturing a nonvolatile semiconductor memory device having improved electric characteristics in the ferroelectric capacitor, such as polarization, dielectric breakdown and leakage current characteristics.

The present invention provides a method for manufacturing a nonvolatile semiconductor memory device comprising the steps of forming a memory cell transistor on a substrate, forming a ferroelectric capacitor overlying the memory cell transistor and having a ferroelectric film between a top electrode and a bottom electrode of the ferroelectric capacitor, forming a first dielectric film at least on the top electrode, forming a second dielectric film made of silicon oxide on the first dielectric film by a chemical vapor deposition (CVD) using tetraethylorthosilicate (TEOS) as a source gas and ozone as an oxidizing agent.

In accordance with the present invention, a nonvolatile semiconductor memory device manufactured by the method has a ferroelectric capacitor having improved characteristics, because deoxidization reaction in the ferroelectric film and diffusion of water into or over the ferroelectric film, which may otherwise occur due to the deposition of the second dielectric film, can be suppressed by the first dielectric film to thereby improve the leakage current, dielectric breakdown and polarization characteristics in the ferroelectric capacitor.

The above and other objects, features and advantages of the present invention will be more apparent from the following description, referring to the accompanying drawings.

PREFERRED EMBODIMENTS OF THE INVENTION

Figure 1:
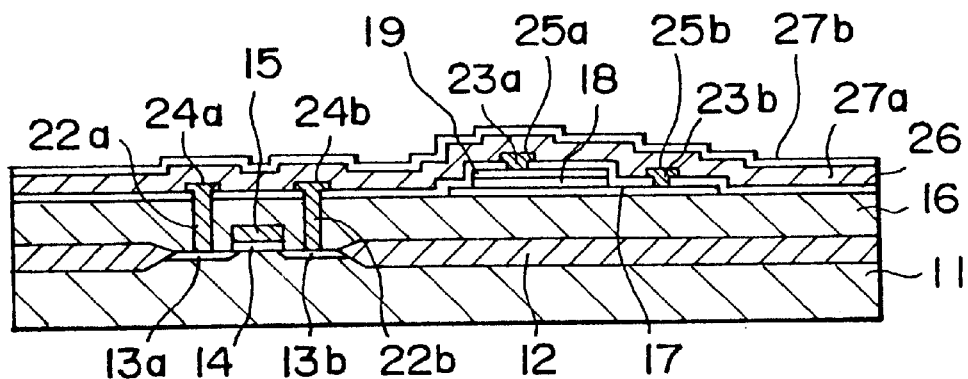
FIG. 1 is a sectional view of a first conventional nonvolatile semiconductor memory device.
Figure 2:
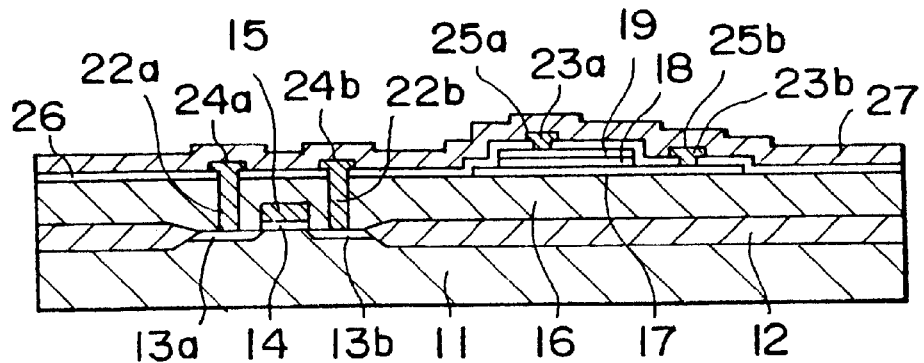
FIG. 2 is a sectional view of a second conventional nonvolatile semiconductor memory device.

Now, the present invention will be more specifically described based on preferred embodiments thereof with reference to the accompanying drawings, wherein similar constituent elements are designated by the same or similar reference numerals throughout the drawings.

Figure 4:
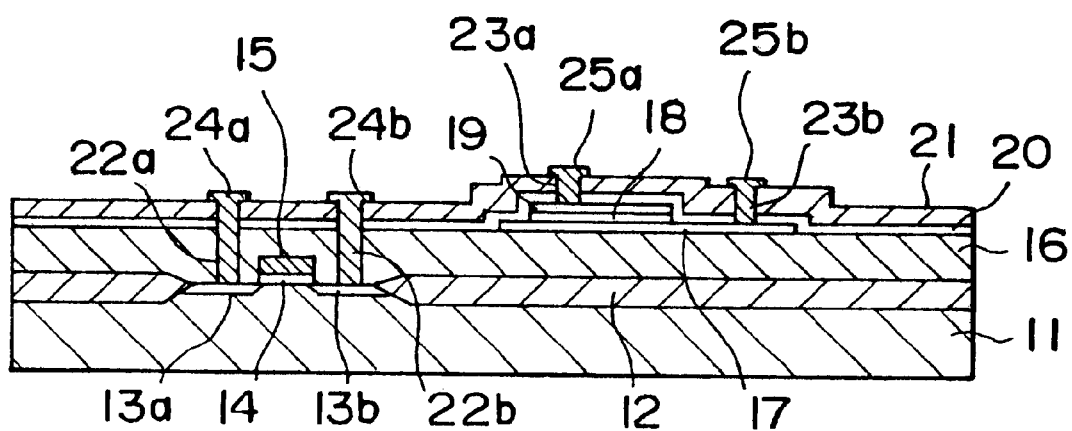
FIG. 4 is a sectional view of a nonvolatile semiconductor memory device according to a first embodiment of the present invention.

FIG. 4 shows a nonvolatile semiconductor memory device having a ferroelectric capacitor according to a first embodiment of the present invention. The nonvolatile memory device has a silicon substrate 11, a field oxide film 12 formed thereon for separation between memory cells, and a switching transistor including source 13a, drain 13b and gate electrode 15 in each memory cell. The memory device further includes an interlayer dielectric film 16 on the switching transistor, and a ferroelectric capacitor formed on the dielectric film 16 and having a top electrode 19 made of Pt and a bottom electrode 17 made of Pt/Ti sandwiching therebetween a ferroelectric film 18 made of $SrBi_2Ta_2O_9$. A protective layer including a first dielectric film 20 and a second dielectric film 21 is formed on the ferroelectric capacitor, and metallic interconnects 24a, 24b, 25a and 25b are formed on the second dielectric film 21 and within through-holes. Another interlayer dielectric film not shown in the figure is formed on the metallic interconnects.

The first dielectric film 20 of the protective layer for the ferroelectric capacitor is formed by a method other than a CVD process, for example, by a sputtering or spin coating technique. The second dielectric film 21 is made of silicon oxide formed by a CVD process using tetraethylorthosilicate (TEOS) as a source gas at a substrate temperature between 350 and 500° C., followed by a heat treatment or annealing at a temperature equal to or above 400° C.

Figure 5A:
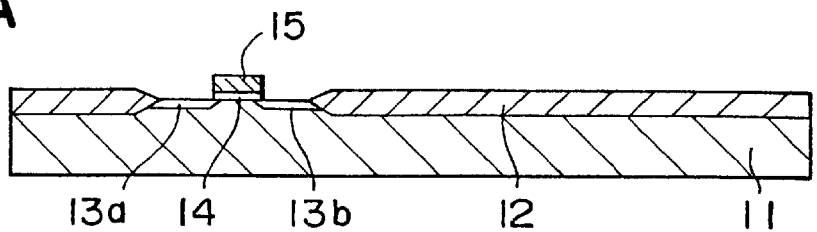
FIGS. 5A to 5E show the nonvolatile semiconductor memory device of FIG. 4 in consecutive steps of a fabrication process therefor.

FIGS. 5A to 5E show the nonvolatile semiconductor memory device of FIG. 4 in consecutive steps of fabrication process for the same. Referring first to FIG. 5A, a thick insulator film 12 made of silicon oxide film is formed by a LOCOS technique on a silicon substrate 11 for element separation, followed by forming a MOS transistor having source 13a, drain 13b and gate electrode 15.

Figure 5B:
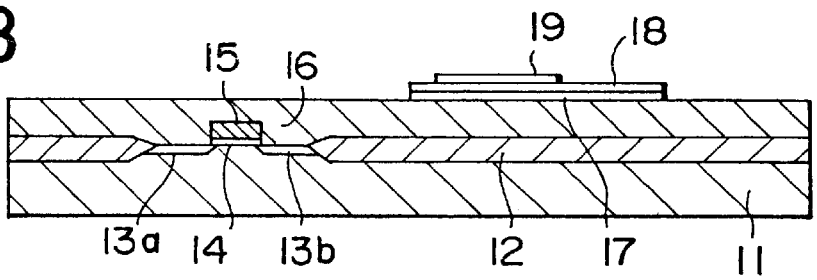

Subsequently, an interlayer dielectric film 16 is formed by sputtering etc. for separating between an overlying ferroelectric capacitor and the MOS transistor in the vertical direction, as shown in FIG. 5B. A bottom electrode 17 for the ferroelectric capacitor was sputtered and patterned therefrom, then a ferroelectric film 18 is deposited thereon, followed by patterning by ion-milling using a photoresist mask not shown. Subsequently, a metallic film is deposited and patterned by ion-milling to obtain the top electrode 19 of the ferroelectric capacitor. The bottom electrode 17 of the ferroelectric capacitor is of a two layer structure such as Pt(200 nm)/Ti(200 nm), wherein Ti improves adhesiveness of the bottom electrode 17 to the underlying silicon oxide film 16. The top electrode 19 of the ferroelectric capacitor is made of a single 200 nm thick Pt film.

The electrodes 17 and 19 for the ferroelectric capacitor are generally made of metals, especially noble metals such as Pt and Au, which are less reactive with other materials. However, the electrodes 17 and 19 may be made of any other metal or conductive metal oxide, such as Ru or oxide thereof. The ferroelectric film 18 sandwiched between the top electrode 19 and bottom electrode 17 is made of $SrBi_2Ta_2O_9$ in this example, and has a thickness of 200 nm. The material for the ferroelectric film 18 may be lead zirconate titanate (PZT), $Bi_4Ti_3O_{12}$ etc. The ferroelectric film 18 is formed by applying a source liquid wherein organic metal is solved in an organic solvent, followed by dehydration and baking thereof. The ferroelectric film 18 may be formed by sputtering or CVD technique instead.

Figure 5C:
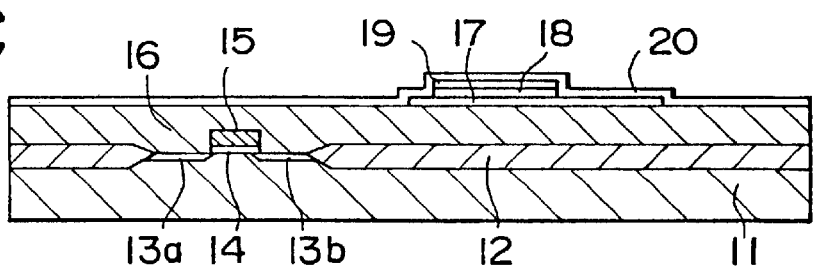
Figure 5D:
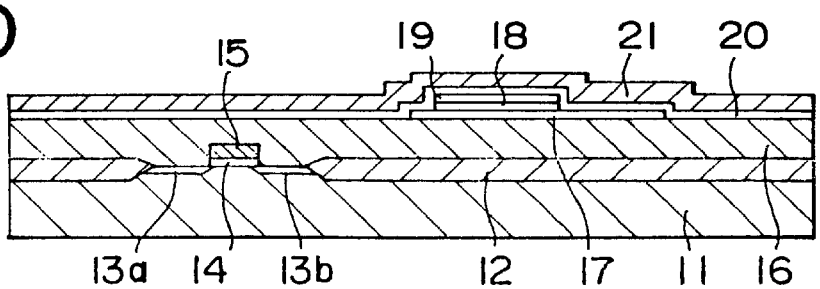

Thereafter, silicon oxide is sputtered to form the first dielectric film 20 of the protective layer for the ferroelectric capacitor in a thickness of 100 nm, as shown in FIG. 5C. The sputtered silicon oxide film 20 contains little water because the sputter is generally effected to a target silicon in an inert gas plasma atmosphere such as Ar or Xe plasma generated in vacuum. The sputtered silicon oxide film is also less hygroscopic. The first dielectric film 20 of the protective layer may be made of silicon nitride instead.

Thereafter, silicon oxide is deposited to form the second dielectric film 21 of the protective layer by a TEOS-CVD process, which uses TEOS source gas in association with an oxidizing agent such as ozone, at a substrate temperature of 450° C. and ambient atmospheric pressure. The TEOS-CVD may be effected at a low atmosphere pressure instead. In either case ambient, the substrate temperature should be maintained between 350 and 500° C.

The TEOS-CVD process using ozone as an oxidizing agent enables film deposition at a lower temperature compared to the case using oxygen as an oxidizing agent, which is detailed in the literature entitled "Reaction Mechanism of Plasma- and Thermal-Assisted Chemical Vapor Deposition of Tetraethylorthosilicate Oxide", Journal of Electrochemical Society, presented by S. Nguyen, D. Dobuzinsky, D. Harmon, R. Gleason, and S. Fridmann.

Some of ferroelectric materials easily react with silicon oxide, when disposed in contact therewith, at a high temperature. Among them, PZT generally forms a crystal structure exhibiting a ferroelectric property after baking in an oxygen atmosphere at a temperature around 600° C. A heat treatment of the crystal structure at a high temperature while laying the same in contact with silicon oxide causes Pb in the PZT to diffuse into the silicon oxide at the boundary therebetween. In order to prevent the degradation of the ferroelectric properties, therefore, the deposition temperature for the ferroelectric film in the ferroelectric capacitor should be as low as possible. In view of the deposition rate for the first dielectric film 20 by TEOS-CVD using ozone as an oxidizing agent, the deposition rate exhibits a maximum at a temperature between 350 and 400° C., which is described in the literature (first literature) as mentioned above and a second literature entitled "Low Temperature Chemical Vapor Deposition of Dielectric Films using Ozone and Organosilane", Extended Abstract of the 19th Conference on Solid State Devices and Materials, by Y. Nishimoto, N. Tokumasu, T. Fukuyama, and K. Maeda.

Figure 6A:
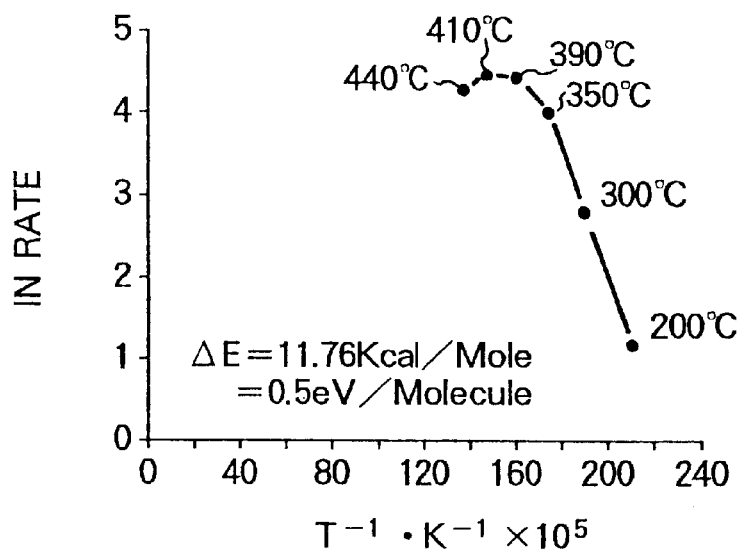
FIGS. 6A and 6B each shows temperature dependence of deposition rate of TEOS film, described in the literature.
Figure 6B:
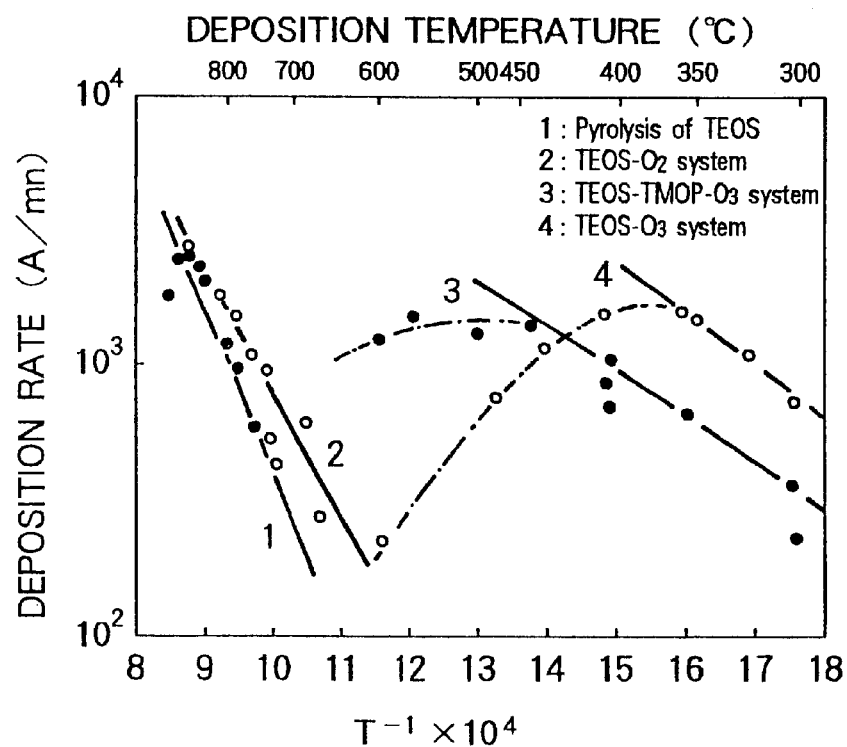

FIG. 6A illustrates a temperature dependency of deposition rate in thermally assisted CVD TEOS oxide process, which is shown in the first literature, and FIG. 6B illustrates temperature and oxidizing agent dependency of the deposition rate, which is shown in the second literature. In FIG. 6A, deposition rate is scaled in logarithm. The maximum deposition rate is considered to be a result of the high efficiency of the reaction between ozone and TEOS in this temperature range. The first literature suggests that the reaction represented by the following formula:

$$Si-(O-C_2H_5)_4 + 8O_3 \rightarrow SiO_2 + 10H_2O + 8CO_2$$

will proceed below 400° C. while limited by the substrate temperature, and proceed between 400 and 500° C. while limited by the surface diffusion. In the temperature range above 400° C., two silanols (Si—OH) well react with each other according to the following formula:

$$Si-OH + Si-OH \rightarrow Si-O-Si + H_2O,$$

whereby Si—O—Si and water are generated to reduce OH radicals in the film, thereby densifying the film.

The water generated in the above reaction detaches from the film surface due to the high temperature so that water in the first dielectric film 20 decreases. For a temperature above 500° C., dissociation of ozone proceeds to make ozone less reactive with TEOS, thereby considerably retarding the deposition of the silicon oxide film. Accordingly, the temperature range between 350 and 500° C. for the deposition is preferable for a sufficient deposition rate by decreasing OH radicals and water in the first dielectric film.

Figure 5E:
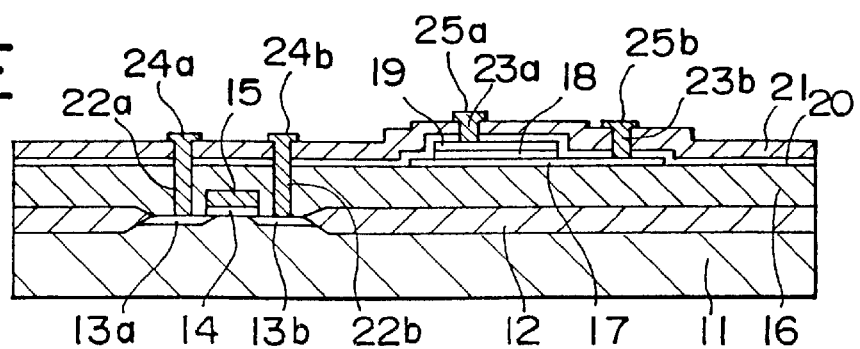

Subsequently, through-holes 22a and 22b for the source/drain regions in the switching transistor and through-holes 23a and 23b for the top and bottom electrodes 19 and 17 of the ferroelectric capacitor are formed, followed by deposition of a metallic film 24a, 24b, 25a and 25b to form the structure of FIG. 5E.

The first embodiment as described above using a two-film structure for the protective layer has an advantage that the presence of the first dielectric film prevents the ferroelectric film from being in direct contact with water or water generated during deposition of the second dielectric film made of TEOS, which would otherwise degrade the ferroelectric film by deoxidization of the ferroelectric material by hydrogen.

The first embodiment has an additional advantage that an excellent CVD film for the first dielectric film can be formed having an excellent coverage property in which overlying metallic interconnects are less susceptible to a short-circuit failure caused by an uneven elevation of the metallic interconnects, which would otherwise occur especially in the case of sputtered protective layer.

The first embodiment has another additional advantage that remaining water or OH radicals in the first dielectric film 20 is low to thereby suppress degradation of the ferroelectric film 18 in the polarization property thereof, which advantage is obtained partly by the temperature maintained between 350 and 500° C. during deposition step of the TEOS film by using oxidation by ozone.

Figure 7A:
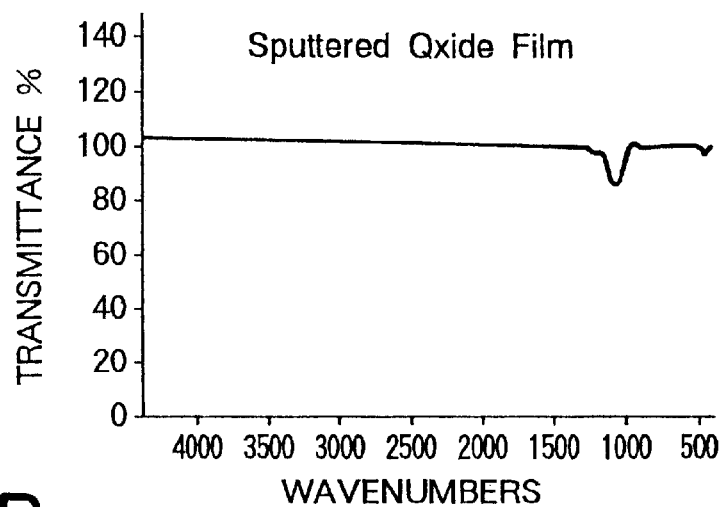
FIGS. 7A, 7B and 7C each shows water content in the ferroelectric film in terms of transmittance measured by an infrared ray spectrometer.
Figure 7B:
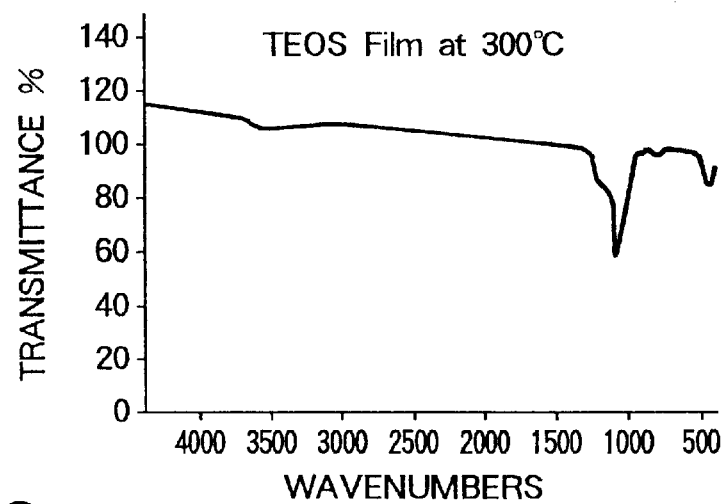
Figure 7C:
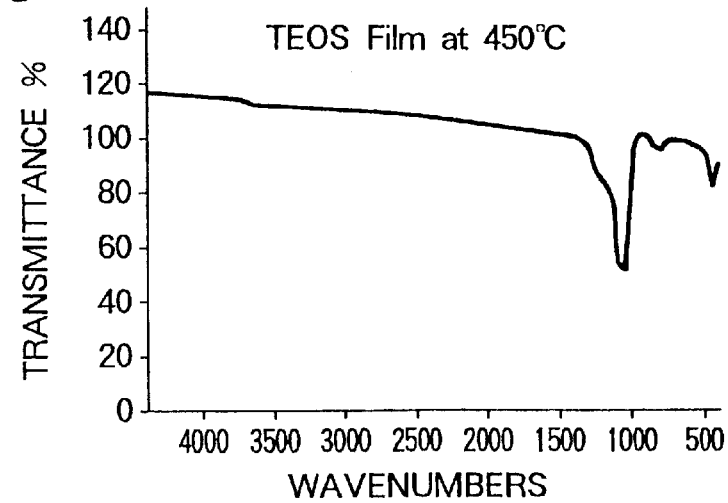
Figure 8A:
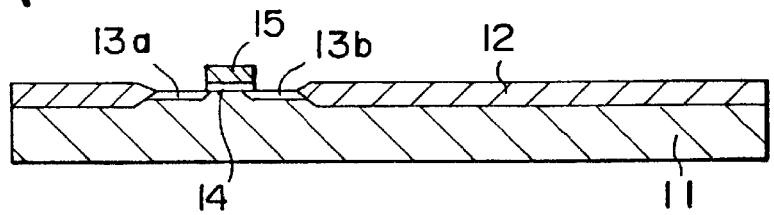
FIGS. 8A to 8E show a nonvolatile semiconductor memory device in consecutive steps of a fabrication process according to a second embodiment of the present invention.
Figure 8B:
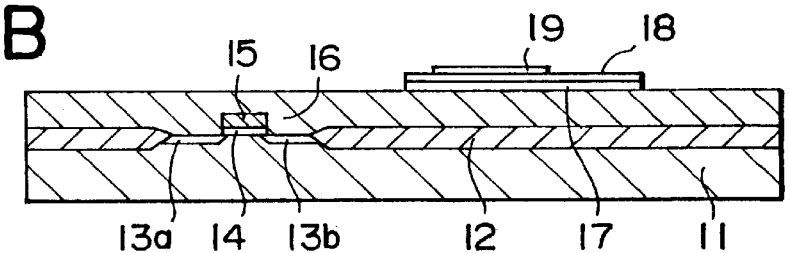
Figure 8C:
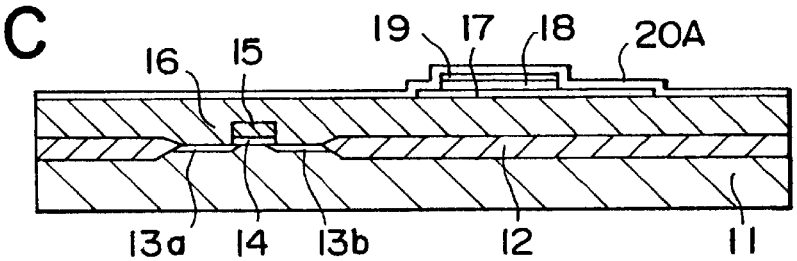
Figure 8D:
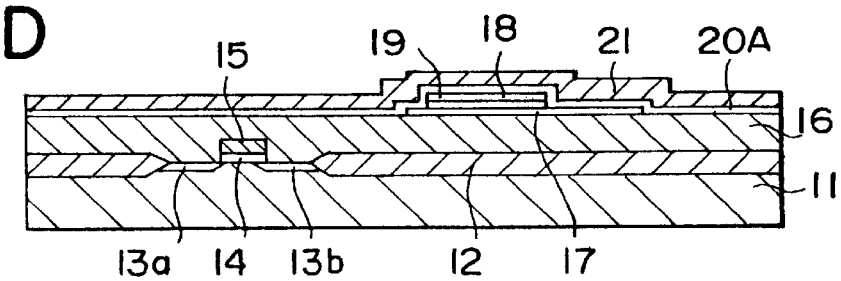
Figure 8E:
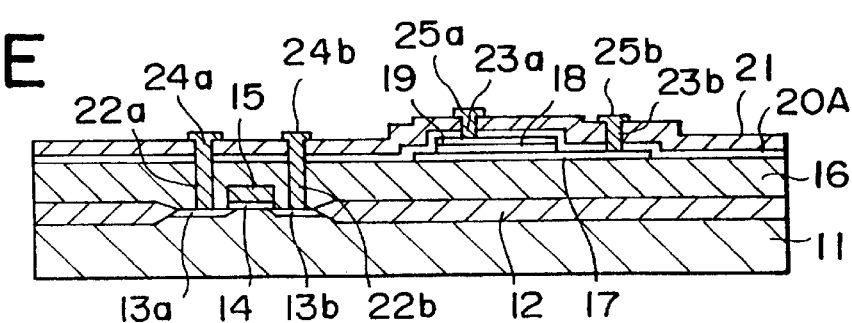

FIGS. 7A, 7B and 7C show transmittance for sputtered film, TEOS film formed at 300° C., and TEOS film formed at 450° C., respectively, measured by infrared ray spectrometer (FT-IR). For the wavenumber at 3330 cm$^{-1}$, it is shown in the figures that transmittance for the TEOS film formed at 300° C. is lower than that for the TEOS film formed at 450° C., which is due to the lower water content in the first dielectric film in the latter case compared to the former case.

Figure 3:
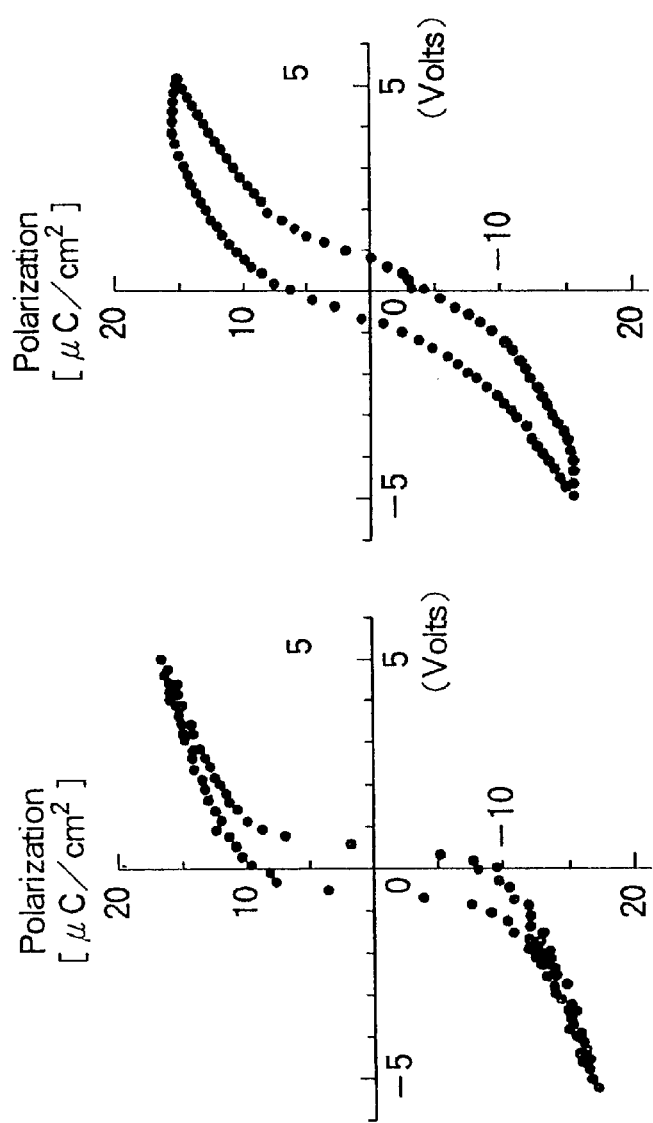
FIGS. 3A, 3B and 3C show polarization characteristics of a ferroelectric film before deposition of protective layer, after deposition of TEOS film at 300° C., and after deposition of TEOS film at 450° C., respectively.

FIGS. 3A and 3B as mentioned before and FIG. 3C show polarization characteristic of the ferroelectric film before deposition of TEOS film, and after deposition of TEOS film at temperatures 300° C. and 450° C., respectively. The polarization decreases in a lesser amount for the case of 450° C. compared to the case of 300° C. The reason therefor is considered that the ferroelectric material is affected by the electric field formed by the polarization of water, which itself has polarized dipoles therein, if the water is present in the vicinity of the ferroelectric material, i.e., in the first dielectric film.

As to the film stress, sputtered silicon oxide film such as the first dielectric film 20 is generally subjected to a compressive stress from the substrate. If it is assumed that all films formed on the substrate are substantially free from the compressive stress from the substrate after sputtering of the first dielectric film, the wafer is warped after the sputtering process such that edge portions of the back surface of the wafer protrudes. The amount of warp increases as the wafer size is increased due to recent requirements for larger wafers. The warp generally causes misalignment during the exposure process in general.

Accordingly, if a TEOS film is deposited on a sputtered silicon oxide film by oxidization of ozone at a high temperature, the TEOS film which is subjected to a tensile stress from the substrate cancels or mitigates the warp of the substrate generated by the sputtering. Tables 1 and 2 show observed warp in microns of the wafer and observed stress in dyne/cm$^2$ of the films for samples, wherein a 100 nm-thick silicon oxide film is sputtered on a bare silicon substrate, followed by depositing a TEOS film by CVD using oxidation by ozone. The warp and stress in the ferroelectric film were measured just after the sputtering, just after the deposition and after 12 days from the deposition.

TABLE 1

| Substrate Temp. during TEOS Deposition | Warp (mm) after Sputtering | Warp (mm) after Deposition of TEOS Film | Warp (mm) 12 Days from Deposition of TEOS Film |
| --- | --- | --- | --- |
| 300 | −2.0 | +5.0 | +1.5 |
| 375 | −3.5 | +11.5 | +5.5 |
| 450 | −5.5 | +11.0 | +7.0 |

TABLE 2

| Substrate Temp. during TEOS Deposition | Stress (dyne/cm$^2$) after Sputtering | Stress (dyne/cm$^2$) after Deposition of TEOS Film | Stress (dyne/cm$^2$) 12 Days after Deposition of TEOS Film |
| --- | --- | --- | --- |
| 300 | −1.49E9 | +1.04E9 | +0.31E9 |
| 375 | −2.33E9 | +1.74E9 | +0.80E9 |
| 450 | −2.63E9 | +1.70E9 | +1.09E9 |

As shown in the tables, deposition of TEOS film improves warp in the substrate and stress in the film applied from the substrate, especially after 12 days from the deposition.

FIGS. 8A to 8E show a method according to a second embodiment of the present invention, similarly to FIGS. 5A to 5E. Similar steps are effected in the second embodiment up to fabrication of the top electrode 19 of the ferroelectric capacitor, as shown in FIGS. 7A and 7B. An inorganic spin-on-glass film 20A is then formed for the first dielectric film by coating over the. entire surface in a condition to obtain a film thickness of 100 nm, followed by a heat treatment in a nitrogen atmosphere at a temperature of 300° C. to remove unnecessary water content. Subsequently, another heat treatment is effected in an oxygen atmosphere at a temperature of 600° C., or at a higher temperature depending on the properties of the ferroelectric materials used. The materials for the SOG film 20A may be an organic material instead. Thereafter, a 400 nm thick oxide film 21 is deposited for the second dielectric film by using TEOS as a source material, similarly to the first embodiment, followed by formation of through-holes 22a, 22b, 23a and 23b and a subsequent deposition and patterning step for a metallic film to form the interconnects 24a, 24b, 25a and 25b.

In the second embodiment using the SOG film as the first dielectric film 20A, two kinds of solution can be used as the source liquid for the SOG film: one is an organic solution wherein organic radicals such as methyl radicals are bonded to silicon; and the other is an inorganic solution wherein OH radicals are bonded to silicon. In either case, a heat treatment after the application of the solution below several hundred degrees (Celsius) provides only a limited film density, thereby leaving carbon or OH radicals in the film. In addition, the film is hygroscopic.

Accordingly, in the second embodiment, a heat treatment or annealing is effected at a temperature as high as 600° C. or above after dehydration of the first dielectric film at a lower temperature, so as to densify the first dielectric film. In this case, the warp problem must be considered. The SOG film has a tendency to be shrink in volume during the spin coating, and thereby subjected to a tensile stress applied from the substrate. The heat treatment in an oxygen atmosphere, however, provides removal of carbon from the SOG film and termination of silicon bonds, thereby alleviating the tensile strength from the substrate more than a heat treatment in a nitrogen atmosphere does. Further, the SOG film is superior in surface flatness to prevent a short-circuit failure in the overlying interconnects.

In a third embodiment of the present invention, the method for fabrication of the memory device according to the first embodiment as described before is modified, with the first step up to the deposition step of the first and second dielectric films of the protective layer being unchanged, by using a heat treatment or annealing for the protective layer in a nitrogen atmosphere at a temperature of 600° C. The heat treatment is effected before formation of contact holes and deposition of the metallic layer.

The advantage of annealing after deposition of the two-film protective layer in the third embodiment will be described hereinafter. The deposition of TEOS film by CVD using oxidation by ozone at the substrate temperature of 450° C. scarcely improves the leakage current characteristic in the ferroelectric capacitor, as mentioned before. The heat treatment at the temperature above 400° C., however, improves the leakage current characteristic.

Figure 9A:
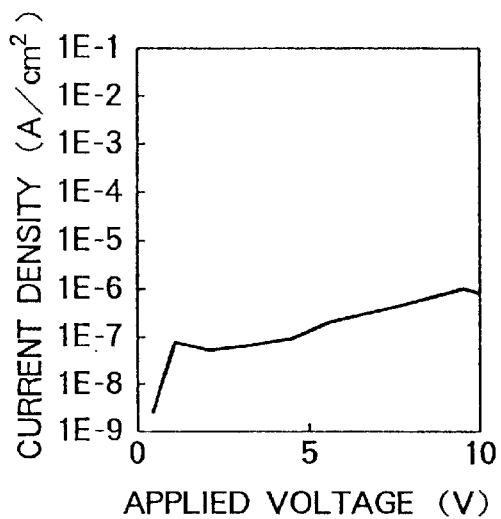
FIGS. 9A to 9D show leakage current characteristics before deposition of protective film, after deposition of TEOS film, after heat treatment of protective film at 400° C. and after heat treatment of protective film at 600° C., respectively.
Figure 9B:
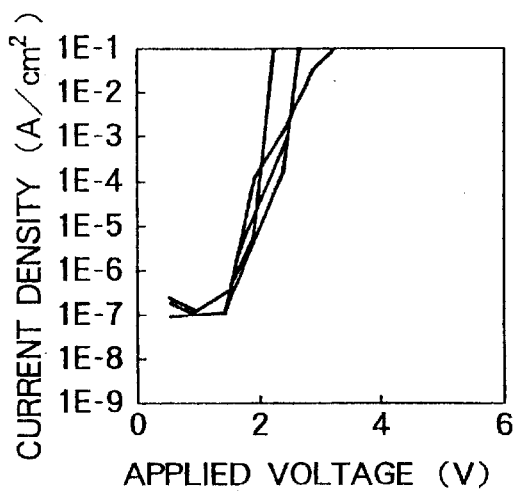
Figure 9C:
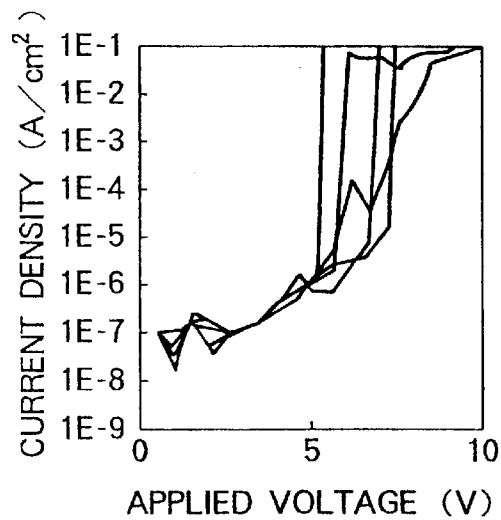
Figure 9D:
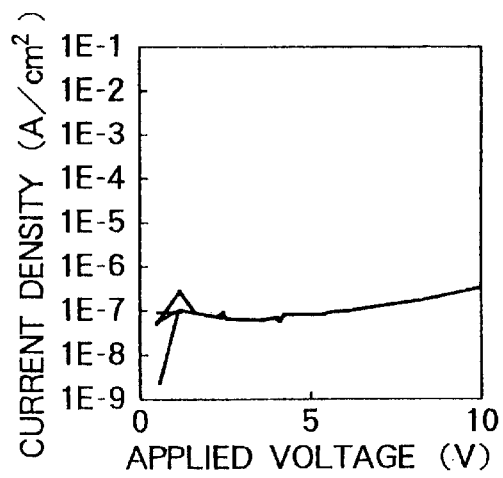

FIGS. 9A, 9B, 9C and 9D show the leakage current characteristic after deposition of protective layer, after deposition of TEOS film, after heat treatment of protective layer at 400° C. and after heat treatment of protective layer at 600° C., respectively. The heat treatment at 400° C. after deposition of protective layer (FIG. 9C) improves the leakage current characteristic to some extent as compared to that just after deposition of protective layer (FIG. 9B). The heat treatment at 400° C. also improves dielectric breakdown characteristic to some extent as will be understood by comparison of FIG. 9C with FIG. 9B. However, the withstand voltage of the capacitor after the heat treatment at 400° C. remains around 5 V, which is significantly lower than the withstand voltage before deposition of the protective film. However, the heat treatment at 600° C. significantly raises the withstand voltage of the ferroelectric capacitor as shown in FIG. 9D.

Although the present invention is described with reference to preferred embodiments thereof, the present invention is not limited thereto and various modifications or alterations can be easily made therefrom by those skilled in the art without departing from the scope of the present invention.

What is claimed is:

1. A method for manufacturing a nonvolatile semiconductor memory device comprising the steps in sequence of (a) forming a ferroelectric capacitor overlying a substrate and having a ferroelectric film between a top electrode and a bottom electrode of the ferroelectric capacitor, (b) forming a first dielectric film on the top electrode and directly in contact with said top electrode by sputtering or spin coating, (c) heat treating the device from step (b) to densify the first dielectric film, and (d) forming a second dielectric film made of silicon oxide on said first dielectric film by a chemical vapor deposition using tetraethylorthosilicate as a source gas and ozone as an oxidizing agent while maintaining the substrate at a temperature of between 350° C. and 500° C.

2. A method for manufacturing a nonvolatile semiconductor memory device as defined in claim 1, wherein said first dielectric film is made of sputtered silicon oxide.

3. A method for manufacturing a nonvolatile semiconductor memory device as defined in claim 1 wherein said first dielectric film is made of spin on glass annealed at a temperature not lower than 600° C.

4. A method for manufacturing a nonvolatile semiconductor memory device as defined in claim 1 further comprising, after said forming step (d), the step (e) of heat treating said memory device.

5. A method for manufacturing an nonvolatile semiconductor memory device as defined in claim 4 wherein said heat treating step (e) is effected at a temperature not lower than 400° C.

6. A method for manufacturing a nonvolatile semiconductor memory device as defined in claim 1, wherein said heat treating step (c) comprises a first heat treatment in a nitrogen atmosphere at a first temperature, and a second heat treatment in an oxygen atmosphere at a second temperature higher than the first temperature.

7. A method for manufacturing a nonvolatile semiconductor memory device as defined in claim 6 wherein said first heat treatment temperature is 300° C., and said second heat treatment temperature is 600° C.

* * * * *